United States Patent [19]

Tsunoda et al.

[11] Patent Number: 4,695,871

[45] Date of Patent: Sep. 22, 1987

[54] LIGHT-TRIGGERED SEMICONDUCTOR DEVICE

[75] Inventors: Yoshiaki Tsunoda; Hideo Matsuda, both of Yokohama, Japan

[73] Assignee: Tokyo Shibaura Denki Kabushiki Kaisha, Japan

[21] Appl. No.: 526,807

[22] Filed: Aug. 26, 1983

[30] Foreign Application Priority Data

Aug. 31, 1982 [JP] Japan .................. 57-149995
Dec. 28, 1982 [JP] Japan .................. 57-230688

[51] Int. Cl.⁴ .................. H01L 23/02; H01L 23/12
[52] U.S. Cl. .................. 357/74
[58] Field of Search .................. 357/74, 79, 80; 350/96.15, 96.20, 96.21, 96.18

[56] References Cited

U.S. PATENT DOCUMENTS 3,992,717 11/1976 Rice .................. 357/74
4,257,058 3/1981 Ferro et al. .................. 357/74

FOREIGN PATENT DOCUMENTS 009330 2/1979 European Pat. Off. .
010352 4/1980 European Pat. Off. .
0021352 6/1980 European Pat. Off. .
054300 7/1982 European Pat. Off. .
985381 8/1962 United Kingdom .
1485695 1/1970 United Kingdom .
1587442 5/1971 United Kingdom .
2005860 4/1979 United Kingdom .
2027991 2/1980 United Kingdom .
2036997 6/1980 United Kingdom .
2053563 2/1981 United Kingdom .

Primary Examiner—William L. Sikes
Assistant Examiner—Robert E. Wise
Attorney, Agent, or Firm—Finnegan, Henderson, Farabow, Garrett & Dunner

[57] ABSTRACT

A light-triggered semiconductor device comprising a light-triggered semiconductor chip housed in an airtight package and a light guide connected to a light-sensitive area of the semiconductor chip, wherein that end face of the light guide which faces the semiconductor chip is chosen to have a larger diameter than the light-sensitive area formed on the main surface of the semiconductor chip, and is connected to the light-sensitive area through an elastic transparent material preliminarily fixed to the light-sensitive area.

3 Claims, 8 Drawing Figures

LIGHT-TRIGGERED SEMICONDUCTOR DEVICE

BACKGROUND OF THE INVENTION

I. Field of the Invention

This invention relates to a light-triggered semiconductor device, and more particularly to an improvement on the light-transmitting mechanism of said light-triggered semiconductor device which is intended to improve the light-transmitting efficiency and reliability of the device.

II. Description of the Prior Art

In recent years, a light-triggered semiconductor device has been widely accepted in which light triggering is effected by applying a light signal as a control medium. A conventional light-triggered thyristor is constructed as shown in FIG. 1. Reference numeral 1 denotes a light-triggered semiconductor chip (hereinafter referred to as "a chip"). The conventional thyristor is triggered by leading out a cathode and anode by a cathode electrode 2c and anode electrode 2a respectively pressed against a cathode electrode layer 1c and anode electrode layer 1a, and supplying a signal light to a light-sensitive area 1g positioned substantially at the center of the main plane on the cathode side. A light guide 3 allowing for the passage of the signal light is formed of an optical fiber. Part of that side of the light guide 3 which lies near one end face 3a thereof is fixed to the chip by an adhesive 4 in such a manner that said one end face 3a faces the light-sensitive area 1g. The light guide 3 is extended along an electrode 2c parallel with the main surface of the chip 1 through a pipe 6 penetrating the peripheral wall 5 of an envelope. The other end face 3b of said light guide 3 faces a light-receiving window 7.

In the conventional technique there is great difficulty in exactly fitting one end face 3a of the light guide 3 to a narrow light-sensitive area 1g. When the light guide 3 assumes the desired position indicated by solid lines in FIG. 2, a light-receiving region occupies an area (a). When, however, one end face of the light guide 3 is partly displaced as indicated by broken lines in FIG. 2, then the end face is partly set over the cathode electrode layer 1c mounted on the light-triggered semiconductor chip 1. At this time, a light-sensitive area occupies a smaller area (a') than the aforementioned proper light-sensitive area (a), thereby reducing the light-transmitting rate.

The above-mentioned conventional light-triggered semiconductor device in which one end face 3a of the light guide 3 is fixed to the chip by the adhesive 4 has the drawback that thermal or mechanical stress resulting from the operation of the thyristor tends to crack or break the light guide 3. This event arises from the difference between the thermal expansion coefficient of copper constituting the main electrode and that of glass. The thermal stress calculated with respect to a light guide 50 mm long runs as follows:

Thermal expansion coefficient of copper . . . $17 \times 10^{-6}$ (deg$^{-1}$)

Thermal expansion coefficient of glass . . . $0.5 \times 10^{-6}$ (deg$^{-1}$)

Assuming $\begin{cases} dl = \beta \cdot l \cdot dT \\ dT = 100° C. \end{cases}$ -continued ($\beta$ denotes a thermal expansion coefficient)

then, $\Delta dl = (17 \times 10^{-6} - 0.5 \times 10^{-6}) \times 50 \times 100 = 0.0825$ mm This Calculation Shows that the above-mentioned thermal stress is quite large.

SUMMARY OF THE INVENTION

This invention has evolved in view of the previously described circumstances, and is intended to provide a light-triggered light transmission semiconductor device which is saved from a reduction in the light-triggering sensitivity and the ratio of di/dt and also from damage to the light guide.

To attain the above-mentioned object, this invention provides a light-triggered semiconductor device which comprises an airtight package enveloping a light-triggered semiconductor chip, a transparent window allowing for the passage of a signal light to a light-sensitive portion of the main surface of the semiconductor chip held in said airtight package, and a light guide connected to the light-sensitive portion of the main surface of said semiconductor chip, wherein that end face of the light guide which faces the semiconductor chip is chosen to have a larger diameter than the light-sensitive area formed on the main surface of the semiconductor chip.

The invention further provides a light-triggered semiconductor device which comprises an airtight package enveloping a light-triggered semiconductor chip, a transparent window allowing for the passage of a signal light to the light-sensitive area of the main surface of the semiconductor chip held in the airtight package, and a light guide connected to the light-sensitive area of the main surface of said semiconductor chip, wherein that end face of the light guide which faces the semiconductor chip is chosen to have a larger diameter than the light-sensitive area formed on the main surface of the semiconductor chip, that end portion of the light guide which faces the semiconductor chip is connected to the light-sensitive area of the main surface of the semiconductor chip through a laminated block consisting of an elastic transparent material attached to the end face of the light guide and another transparent material deposited over the light-sensitive area and is formed of a pair of mutually engaged members, and one of the mutually engaged members is securely supported in a prescribed position on the main surface of the semiconductor chip by means of a material previously fixed on the main surface.

DETAILED DESCRIPTION OF THE PREFERRED EMBODIMENTS

Figure 1:
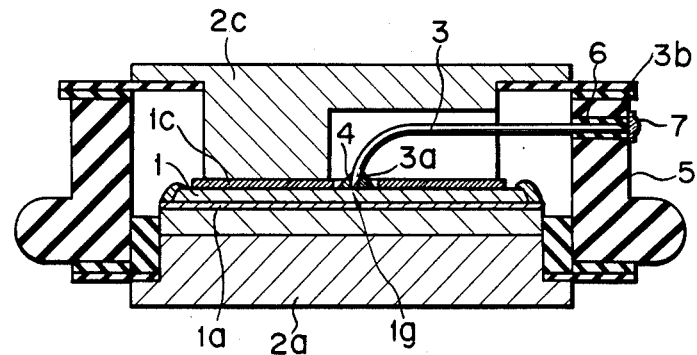
FIG. 1 is a cross-sectional view of the conventional light-triggered thyristor.
Figure 2:
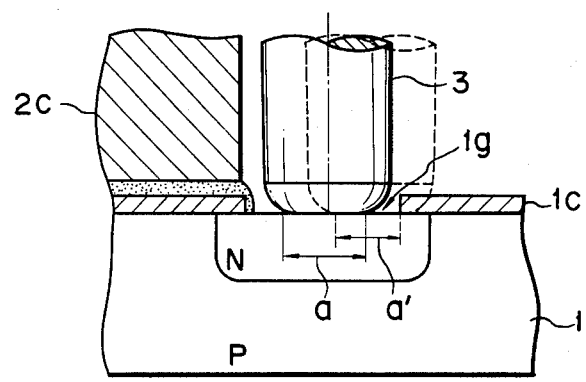
FIG. 2 is a cross-sectional view of the main part of the conventional light-triggered thyristor.
Figure 3:
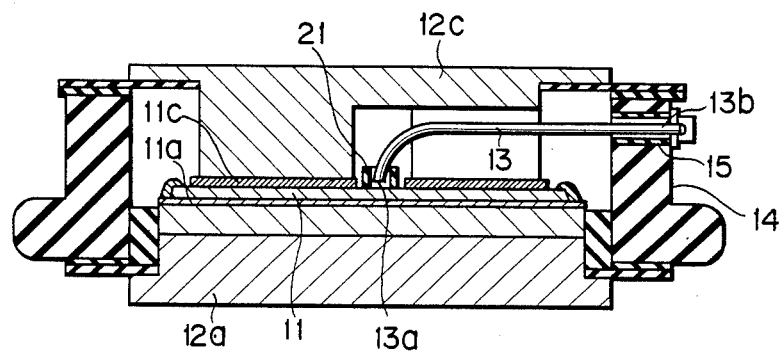
FIG. 3 is a cross-sectional view of a light-triggered thyristor according to a first embodiment of this invention.
Figure 4:
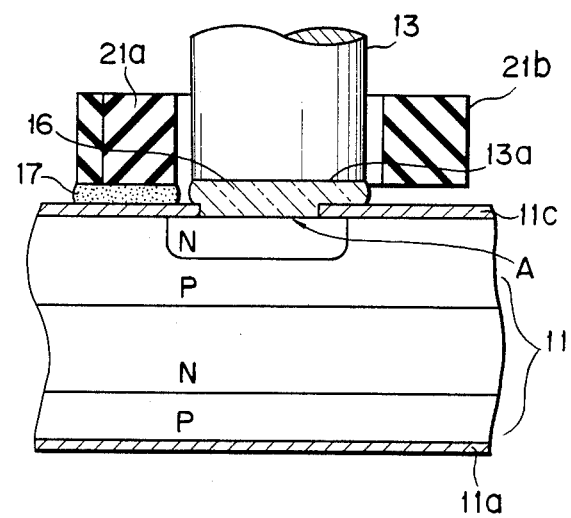
FIG. 4 is an enlarged sectional view of the main part of the light-triggered thyristor of FIG. 3.

Description will now be given with reference to FIGS. 3 to 8 of a light-triggered semiconductor device embodying this invention. FIGS. 3 and 4 denote a light-triggered thyristor according to a first embodiment of the invention. Reference numeral 11 denotes a semiconductor chip. Electrode layers 11a, 11c mounted on both main surfaces of the thyristor are respectively pressed against the intervening semiconductor chip by the corresponding electrode supports 12a, 12c to lead out a cathode and anode. A signal light is projected on a light-sensitive area A formed substantially at the center of that main surface of the thyristor which faces the cathode. A light guide through which a signal light is projected on the thyristor is formed of an optical fiber 13. One end face 13a of the optical fiber 13 is set opposite the light-sensitive area A. The one end face 13a is chosen to have a larger area than that of the light-sensitive area A. The optical fiber 13 is extended along the electrode support 12c in parallel with the main surface of the semiconductor chip 11 through a pipe 15 penetrating the peripheral wall of an envelope 14 in such a manner that the other end face 13b of the optical fiber 13 lies near the light-receiving window. Both end faces 13a, 13b of the light guide 13 are fitted with an elastic transparent material such as a piece of silicone rubber 16 having the same refraction index as the light guide 13.

That end face of the light guide which is set opposite to the semiconductor chip 11 may be indirectly connected to the main surface of the semiconductor chip 11 by means of a light guide-locating device 21 consisting of a pair of mutually engaged components 21a, 21b shown in FIG. 4. In this case, one component 21a of the light guide-locating device 21 is previously fixed to the main surface of the semiconductor chip 11 by means of an adhesive 17.

Figure 5:
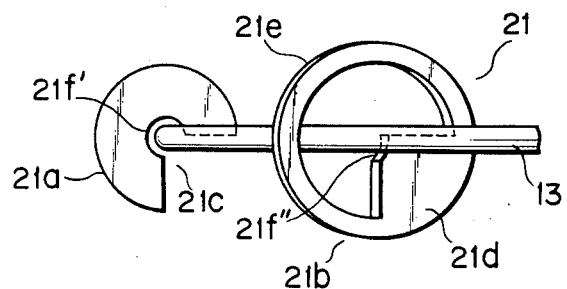
FIG. 5 is an oblique view of a light guide-locating device embodying this invention.
Figure 6:
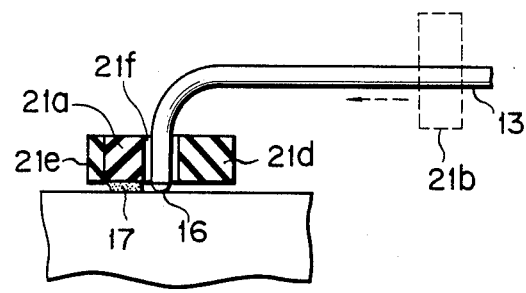
FIG. 6 is a side view of the light guide-locating device of FIG. 5.
Figure 7:
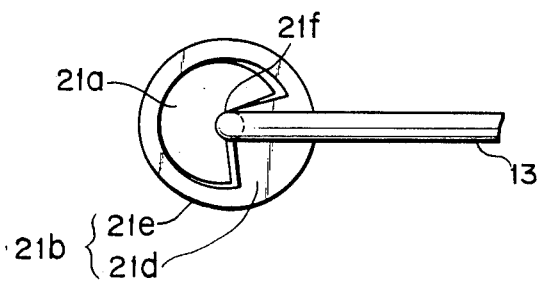
FIG. 7 is an oblique view of a light guide securely set in place by the locating device of FIG. 5.

Detailed description will now be given with reference to FIGS. 5 to 7 of the light guide-locating device 21. FIG. 5 shows the step of fixing the light guide or optical fiber 13 by means of the locating device 21. As seen from FIG. 5, the light guide-locating device 21 is formed of a first locating component 21a and a second elastic locating component 21b. The first locating component 21a comprises a disc provided with a segmental notch 21c having a control angle, for example, of 90°. The second locating component 21b is provided with a segmental portion 21d engageable with the segmental notch 21c of the first locating component 21a. The second locating component 21b is further provided with an annular member 21e substantially engageable with the outer periphery of the disc section of the first locating component 21a. The central portions of both locating components 21a, 21b are respectively provided with notches 21f', 21f'' which jointly define a circular opening 21f when both locating components 21a, 21b are engaged with each other. The first locating component 21a is fixed to the surface of the chip 11 by means of an adhesive 17 (FIG. 6), thereby causing the circular opening 21f to be exactly positioned on the light-sensitive area A. Thereafter, that end face 13a of the light guide 13 which has been fitted with an elastic transparent strip, for example, a piece of silicone rubber is inserted into the circular opening 21f. The light guide 13 is inserted into the second locating component 21b. This second locating component 21b is tightly fitted around the peripheral wall of the first locating component 21a by utilizing the elasticity of the second locating component 21b (FIG. 7). The above-mentioned process enables the end face 13a of the light guide 13 to be exactly set on the light-sensitive area A.

Figure 8:
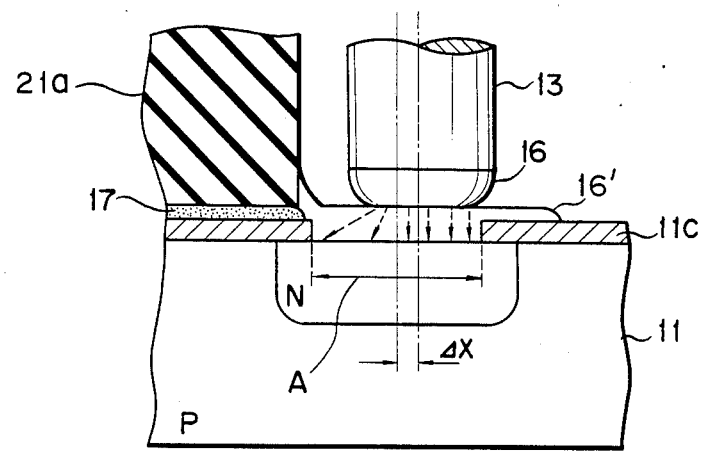
FIG. 8 is a fractional sectional view of a light-triggered thyristor according to a second embodiment of the invention.

The foregoing embodiment relates to the case where the elastic transparent material 16 (for example, a piece of silicone rubber) was fitted to that end face 13a of the light guide 13 which faced the semiconductor chip 11. However, it is possible to coat an elastic transparent material having the same refraction index as the light guide fully over the light-sensitive area A. FIG. 8 illustrates the above-mentioned process. Namely, an elastic transparent material 16' is fitted fully over the light-sensitive area A. The other elements of FIG. 8 are the same as those of FIG. 3, and denoted by the same numerals, so the description has been omitted.

The coating of the elastic transparent material 16', for example, a piece of silicone rubber on the light-sensitive area A offers the advantages that even when the end face 13a of the light guide 13 which is set opposite to the semiconductor chip is somewhat displaced (to an extent of Δx as indicated in FIG. 8), a light can be projected over the whole of the light-sensitive area A by the refraction index of the silicone rubber as indicated by broken line arrows given in FIG. 8; the whole area of the light-sensitive area A functions effectively, thereby enabling the whole of the light-sensitive area to be uniformly lighted without a decline in the light-triggering sensitivity; the ratio of di/dt is prevented from falling; the coating of the transparent silicone rubber on the light-sensitive area A exerts substantially no harmful effect in the light transmitting efficiency; and further the application of the silicone rubber has a cushioning effect against a lengthwise mechanical stress caused by the connection between the end face of the light guide 13 and the light-sensitive area A.

The above-mentioned silicone rubber is still viscous when it is applied, and consequently can be made into a semispherical form (FIG. 8) by applying surface tension. However, it is possible to mold the silicone rubber into any other desired shape.

This invention is further applicable to a light-triggered semiconductor device in which the light guide penetrates the envelope perpendicularly to the main light-sensitive area of a semiconductor chip. The transparent material need not be limited to silicone rubber, but may be prepared from any other suitable material, provided its refraction index meets the requirements. The invention is applicable not only to a light-triggered thyristor or phototransistor but also to any other semiconductor device.

With a light-triggered semiconductor device embodying this invention, that end face of the light guide which faces the semiconductor chip is chosen to have a larger diameter than the opening of the light-sensitive area of the main surface of the semiconductor chip, and, as the need arises, a transparent material is coated over the light-sensitive area. Even if, therefore, the light guide is slightly displaced from the light-sensitive area, light can be fully radiated over the whole of the light-sensitive area. Consequently, there will be obtained advantages such as the light-triggering sensitivity of the subject device not decreasing, the light-sensitive area being uniformly illuminated, thereby saving a decline in the ratio di/dt, and the light guide and light-sensitive area not being fixed together, thereby preventing the light guide from cracking or breaking from thermal or mechanical strains. The application of expandable silicone rubber to that end face of the light guide which faces the semiconductor chip will render the subject device permanently resistant to the linear stress.

After all, this invention provides a highly efficient and reliable light-triggered semiconductor device in which the light sensitivity and the ratios dv/dt and di/dt are prevented from being reduced.

What is claimed is:

1. A light-triggered thyristor which comprises:

at least one light-triggered semiconductor chip having a light-sensitive area;

means for providing an airtight enclosure for said at least one light-triggered semiconductor chip;

transparent means proximate the periphery of said air-tight enclosure means for receiving light, said transparent means positioned outside an area directly above said light-sensitive area;

guide means for projecting light within said airtight enclosure means an onto said light-sensitive area, said guide means having a first end connected to said transparent means, a second end connected adjacent to said light-sensitive area and an intermediate portion between said first and second ends, wherein said second end includes an elastic transparent material fitted thereon and wherein said said second end has a larger transverse section than said light-sensitive area; and a light guide-locating assembly for locating said transverse section to project light therefrom substantially uniformly onto all of said light sensitive area and having a fixed member attached to said chip, said fixed member being positioned around at least a portion of said guide means proximate said second end, said locating assembly also having a flexible member enveloping at least a substantial portion of both said guide means and said fixed member, while engaging at least a portion of said fixed member.

2. The light-triggered semiconductor device defined in claim 1, wherein said transparent material is silicone rubber.

3. The light-triggered semiconductor device defined in claim 1, wherein said fixed member is a partial disc having means for receiving said guide means and restricting lateral movement thereof, and wherein said flexible member includes interior surface means for cooperating with said fixed member and said elastic transparent material to position said guide means proximate said light-sensitive area.

* * * * *

UNITED STATES PATENT AND TRADEMARK OFFICE
CERTIFICATE OF CORRECTION

PATENT NO. : 4,695,871
DATED : September 22, 1987
INVENTOR(S) : Yoshiaki TSUNODA, et al.

It is certified that error appears in the above-identified patent and that said Letters Patent is hereby corrected as shown below:

In Claim 1, Column 5, Line 24; change

"an" should be --and--

Signed and Sealed this

Twenty-fourth Day of May, 1988

*Attest:*

DONALD J. QUIGG

*Attesting Officer*    *Commissioner of Patents and Trademarks*